US010273797B2

United States Patent
Li et al.

(10) Patent No.: US 10,273,797 B2
(45) Date of Patent: Apr. 30, 2019

(54) CASING AND CEMENT EVALUATION TOOL WITH REDUCED TRANSMITTER RINGING

(71) Applicant: Halliburton Energy Services, Inc., Houston, TX (US)

(72) Inventors: Peng Li, Houston, TX (US); Zheng Chen, Katy, TX (US); Batakrishna Mandal, Missouri City, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 181 days.

(21) Appl. No.: 15/311,636

(22) PCT Filed: Apr. 28, 2016

(86) PCT No.: PCT/US2016/029730
§ 371 (c)(1),
(2) Date: Nov. 16, 2016

(87) PCT Pub. No.: WO2016/191025
PCT Pub. Date: Dec. 1, 2016

(65) Prior Publication Data
US 2017/0175514 A1 Jun. 22, 2017

Related U.S. Application Data

(60) Provisional application No. 62/165,726, filed on May 22, 2015.

(51) Int. Cl.
E21B 47/00 (2012.01)
H04B 1/10 (2006.01)
(Continued)

(52) U.S. Cl.
CPC .......... *E21B 47/0005* (2013.01); *E21B 47/14* (2013.01); *H03F 1/34* (2013.01);
(Continued)

(58) Field of Classification Search
CPC ...... E21B 47/0005; E21B 47/14; H04B 15/02
See application file for complete search history.

(56) References Cited

U.S. PATENT DOCUMENTS 3,474,400 A * 10/1969 Auer, Jr. .................. G01S 1/72
327/18
5,469,736 A * 11/1995 Moake .................. E21B 47/082
166/254.2
(Continued)

OTHER PUBLICATIONS

International Search Report and Written Opinion issued in related PCT Application No. PCT/US2016/029730 dated Aug. 9, 2016, 15 pages.
(Continued)

*Primary Examiner* — Krystine E Breier
(74) *Attorney, Agent, or Firm* — Benjamin Fite; Baker Botts L.L.P.

(57) ABSTRACT

An example cement and casing evaluation tool includes an amplifier and a filter coupled an output of the amplifier. A transducer may be coupled to the output of the filter. A ringing reduction system may be coupled to at least one of the amplifier, the filter, and the transducer, wherein the ringing reduction system selectively dissipates energy from at least one of the amplifier, the filter, and the transducer in response to a control signal.

17 Claims, 6 Drawing Sheets

(51) Int. Cl.
*H04B 15/02* (2006.01)
*E21B 47/14* (2006.01)
*H03F 1/34* (2006.01)
*H03F 3/24* (2006.01)
*H04B 1/04* (2006.01)

(52) U.S. Cl.
CPC ............... *H03F 3/24* (2013.01); *H04B 1/10* (2013.01); *H04B 15/02* (2013.01); *H04B 2001/0433* (2013.01)

(56) References Cited

U.S. PATENT DOCUMENTS

| | | | |
|---|---|---|---|
| 5,724,308 A * | 3/1998 | Sorrells | G01V 1/46 181/103 |
| 6,650,111 B2 * | 11/2003 | Christensen | G01V 3/104 324/207.12 |
| 7,525,872 B2 | 4/2009 | Tang et al. | |
| 7,554,882 B2 | 6/2009 | Garcia-Osuna et al. | |
| 2011/0149684 A1 | 6/2011 | Hurst et al. | |
| 2013/0010439 A1 | 1/2013 | Pabon et al. | |
| 2014/0056101 A1 | 2/2014 | Vu et al. | |
| 2016/0033663 A1 * | 2/2016 | Lu | G01V 1/52 367/25 |
| 2017/0212264 A1 * | 7/2017 | Zhao | G01V 1/523 |

OTHER PUBLICATIONS

International Preliminary Report on Patentability issued in related PCT Application No. PCT/US2016/029730, dated Dec. 7, 2017, 1 pages.

* cited by examiner

CASING AND CEMENT EVALUATION TOOL WITH REDUCED TRANSMITTER RINGING

CROSS-REFERENCE TO RELATED APPLICATION

The present application is a U.S. National Stage Application of International Application No. PCT/US2016/029730 filed Apr. 28, 2016, which claims benefit of U.S. Provisional Application No. 62/165,726 filed May 22, 2015, both of which are incorporated herein by reference in their entirety for all purposes.

The present disclosure relates generally to well drilling and completion operations and, more particularly, to a casing and cement evaluation tool with reduced transmitter ringing.

Well drilling and completion operations sometimes require the use of casings within a wellbore in a subterranean formation to ensure that the wellbore does not collapse once it is drilled and that sensitive areas of the formation are protected and isolated. In most cases the casings are secured in the wellbore using a cement layer that fills an annulus between and bonds to both the casing and the formation. The strength of both cement bonds is important to the integrity of the well. Measuring cement impedance can provide information about the strength of the cement bonds.

Some casing and cement evaluation tools transmit an acoustic pulse into the casing and cement layer, and receive an echo signal of that pulse. The echo signal may include reflections and reverberations caused by the casing, the cement layer, and an interface between the two. These reflections and reverberations may be used, in part, to calculate the cement impedance. In some instances, the echo signal may have a small amplitude, such that it is sensitive to and distorted by noise. One example source of noise is the firing mechanisms of the evaluation tool that generated the acoustic pulse. This noise may reduce the accuracy of the cement impedance calculation and otherwise reduce the effectiveness of the tool.

FIGURES

Some specific exemplary embodiments of the disclosure may be understood by referring, in part, to the following description and the accompanying drawings.

Figure 4:
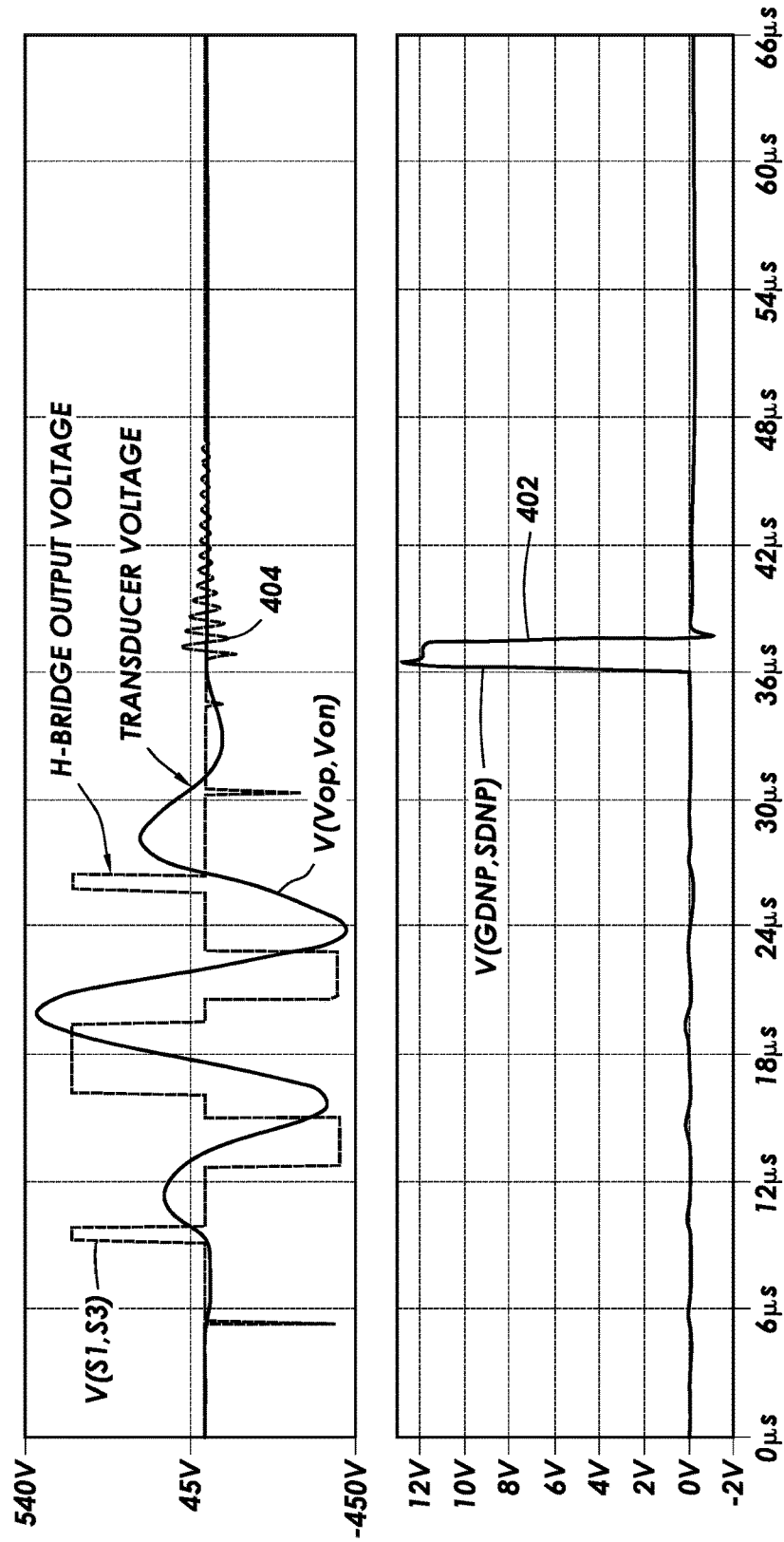

FIG. 4 includes two charts, one illustrating example voltage signals for an amplifier and transducer, and the other illustrating an example dump circuit gate signal, according to aspects of the present disclosure.

Figure 5:
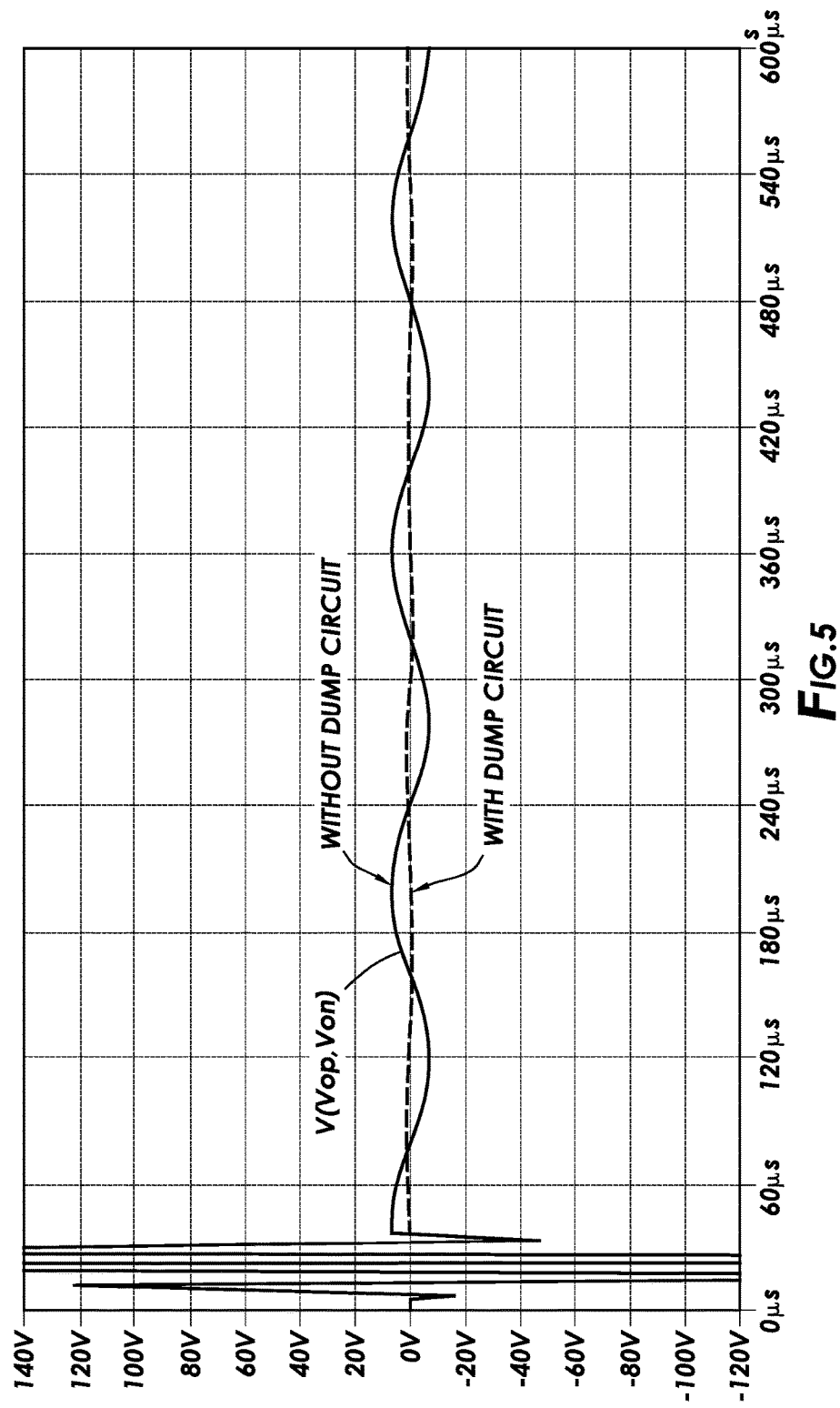

FIG. 5 is a chart illustrating the reduction in ringing signals, according to aspects of the present disclosure.

Figure 6:
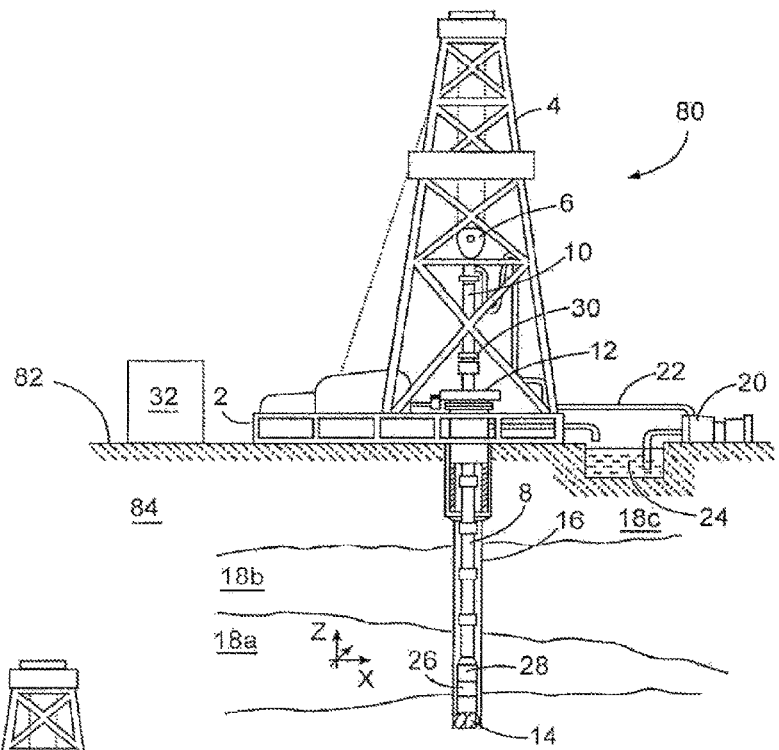

FIG. 6 is a diagram showing an illustrative drilling system, according to aspects of the present disclosure.

Figure 7:
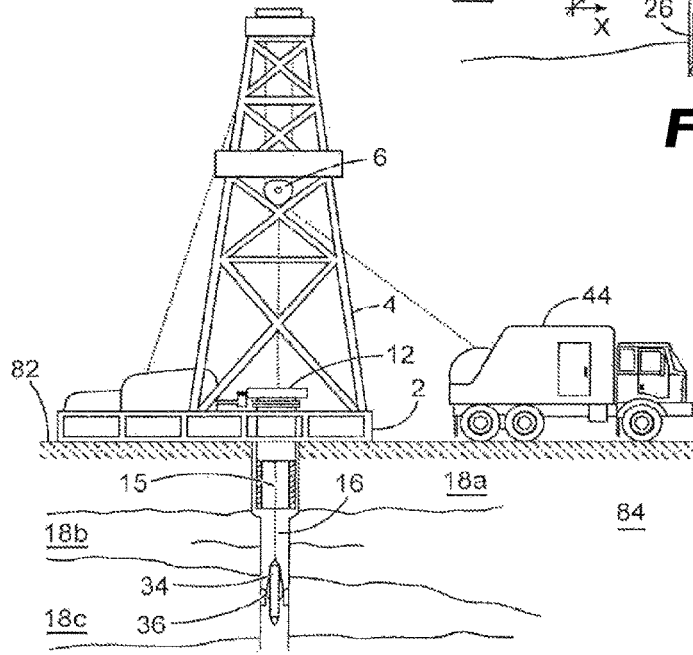

FIG. 7 is a diagram showing an illustrative wireline logging system, according to aspects of the present disclosure.

While embodiments of this disclosure have been depicted and described and are defined by reference to exemplary embodiments of the disclosure, such references do not imply a limitation on the disclosure, and no such limitation is to be inferred. The subject matter disclosed is capable of considerable modification, alteration, and equivalents in form and function, as will occur to those skilled in the pertinent art and having the benefit of this disclosure. The depicted and described embodiments of this disclosure are examples only, and not exhaustive of the scope of the disclosure.

DETAILED DESCRIPTION

The present disclosure relates generally to well drilling and completion operations and, more particularly, to a casing and cement evaluation tool with reduced transmitter ringing.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communication with external devices as well as various input and output (I/O) devices, such as a keyboard, a mouse, and a video display. The information handling system may also include one or more buses operable to transmit communications between the various hardware components. It may also include one or more interface units capable of transmitting one or more signals to a controller, actuator, or like device.

For the purposes of this disclosure, computer-readable media may include any instrumentality or aggregation of instrumentalities that may retain data and/or instructions for a period of time. Computer-readable media may include, for example, without limitation, storage media such as a direct access storage device (e.g., a hard disk drive or floppy disk drive), a sequential access storage device (e.g., a tape disk drive), compact disk, CD-ROM, DVD, RAM, ROM, electrically erasable programmable read-only memory (EEPROM), and/or flash memory; as well as communications media such wires, optical fibers, microwaves, radio waves, and other electromagnetic and/or optical carriers; and/or any combination of the foregoing.

Illustrative embodiments of the present disclosure are described in detail herein. In the interest of clarity, not all features of an actual implementation may be described in this specification. It will of course be appreciated that in the development of any such actual embodiment, numerous implementation specific decisions are made to achieve the specific implementation goals, which will vary from one implementation to another. Moreover, it will be appreciated that such a development effort might be complex and time-consuming, but would nevertheless be a routine undertaking for those of ordinary skill in the art having the benefit of the present disclosure.

To facilitate a better understanding of the present disclosure, the following examples of certain embodiments are given. In no way should the following examples be read to limit, or define, the scope of the disclosure. Embodiments of the present disclosure may be applicable to horizontal, vertical, deviated, or otherwise nonlinear wellbores in any type of subterranean formation. Embodiments may be applicable to injection wells as well as production wells, including hydrocarbon wells. Embodiments may be implemented using a tool that is made suitable for testing, retrieval and sampling along sections of the formation. Embodiments may be implemented with tools that, for example, may be conveyed through a flow passage in tubular string or using a wireline, slickline, coiled tubing, downhole robot/tractor or the like.

The terms "couple" or "couples" as used herein are intended to mean either an indirect or a direct connection. Thus, if a first device couples to a second device, that connection may be through a direct connection or through an indirect mechanical or electrical connection via other devices and connections. Similarly, the term "communicatively coupled" as used herein is intended to mean either a direct or an indirect communication connection. Such connection may be a wired or wireless connection such as, for example, Ethernet or LAN. Such wired and wireless connections are well known to those of ordinary skill in the art and will therefore not be discussed in detail herein. Thus, if a first device communicatively couples to a second device, that connection may be through a direct connection, or through an indirect communication connection via other devices and connections.

Modern petroleum drilling and production operations demand information relating to parameters and conditions downhole. Several methods exist for downhole information collection, including logging-while-drilling ("LWD") and measurement-while-drilling ("MWD"), and wireline. In LWD, data is typically collected during the drilling process, thereby avoiding any need to remove the drilling assembly to insert a wireline logging tool. LWD consequently allows the driller to make accurate real-time modifications or corrections to optimize performance while minimizing down time. MWD is the term for measuring conditions downhole concerning the movement and location of the drilling assembly while the drilling continues. LWD concentrates more on formation parameter measurement. While distinctions between MWD and LWD may exist, the terms MWD and LWD often are used interchangeably. For the purposes of this disclosure, the term LWD will be used with the understanding that this term encompasses both the collection of formation parameters and the collection of information relating to the movement and position of the drilling assembly.

Figure 1:
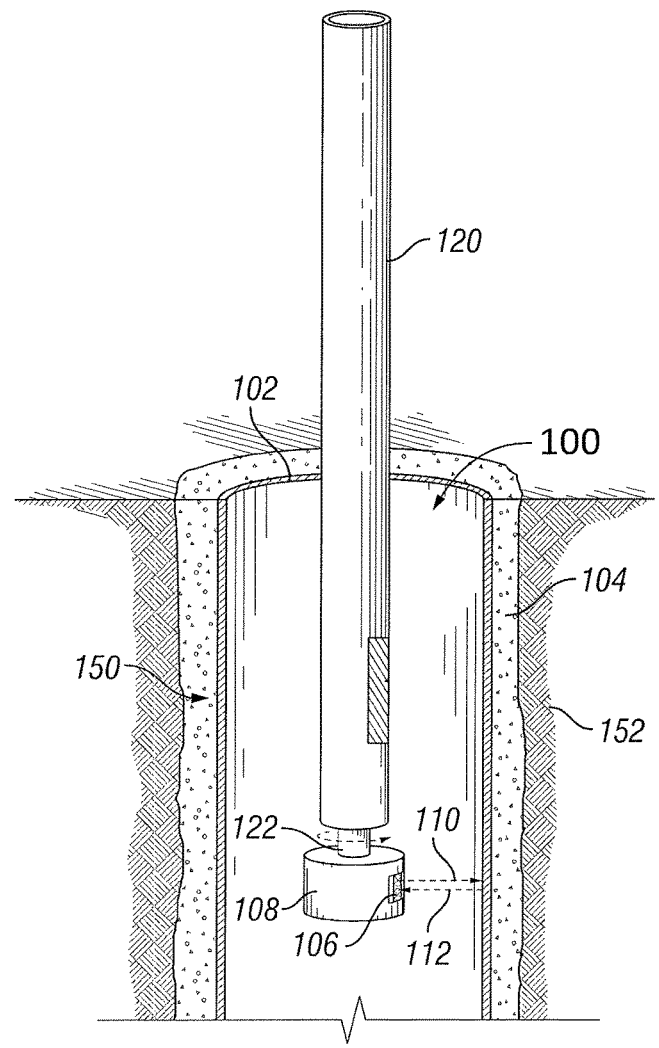
FIG. 1 is a diagram illustrating an example casing and cement evaluation tool, according to aspects of the present disclosure.

FIG. 1 is a diagram illustrating an example casing and cement evaluation tool 100, according to aspects of the present disclosure. The tool 100 may be suspended (e.g. via wireline, slickline, coiled tubing, drill pipe/tubing, downhole tractor, or the like) within a wellbore 150 in a subterranean formation 152. As depicted, the tool 100 may be positioned within a casing 102 that is secured in the wellbore 150 by a cement layer 104 that substantially fills the annulus between the casing 102 and the wellbore 150. The casing 102 may comprise a metal tubular with a pre-determined length and diameter that is specifically selected for a particular depth in the formation 152. Although only one casing 102 is shown in FIG. 1, multiple casings may be used, including in a telescopic orientation where casings with progressively smaller diameters are used as the wellbore 150 extends further into the formation 152. The casing 112 may prevent the wellbore 150 from collapsing, prevent sensitive formation strata from exposure to downhole fluids, and prevent unwanted formation fluids from entering the wellbore 150.

The tool 100 comprises an elongated tool body 120 comprising a rotating portion 108 with an acoustic transducer 106 coupled thereto. Example acoustic transducers include, but are not limited to, piezoelectric crystals, geophones, electromagnetic elements, etc. As depicted, the rotating portion 108 comprises a rotating head positioned at a distal end of the elongated tool body 120. In other embodiments, the rotating portion 108 may be positioned at one or more intermediate portions of the elongated tool body 120, which may provide greater flexibility with respect to the tool design. As depicted, the diameter of the rotating portion 108 is larger than the diameter of the elongated tool body 120, but other configurations are possible within the scope of the present disclosure.

The rotating portion 108 may be driven by an electric motor (not shown) through a drive shaft 122 or another suitable drive mechanism that provides for the controlled rotational movement of the rotating portion 108 with respect to the tool 100. As depicted, the rotating portions 108 may be driven through a shaft connecting the rotating portion 108 to a drive mechanism within the elongated tool body 120. Power for the drive mechanism and other elements within the tool 100 may be provided, for instance, through the means of suspension, or by one or more power sources, e.g., batteries, capacitors, generators, within the tool 100.

In use, the transducer 106 may transmit a directional acoustic pulse 110 to the casing 102 at a first azimuthal location with respect to the tool 100. The directional acoustic pulse 110 is not limited with respect to frequency and can but is not required to be an ultrasonic pulse. The pulse 110 may contact, be reflected by, and/or cause to reverberate the casing 102, the cement layer 104, and the interface between the casing 102 and the cement layer 104. These reflections and reverberations may comprise an echo signal 112 that is received by the transducer 106.

After the echo signal 112 is received from the first azimuthal location, the head 108 may be rotated to a second azimuthal location within the wellbore 150. Another pulse may then be transmitted from the transducer 106, and a corresponding echo signal may be received at the transducer 106. The head 108 then may be rotated to a third azimuthal location within the wellbore 150 and yet another pulse may then be transmitted from the transducer 106, and a corresponding echo signal may be received at the transducer 106. The first, second and third azimuthal locations may but are not required to be equal rotational intervals with respect to the tool 100. For instance, the angular difference between the azimuthal locations may be modified in real time depending on the signals received and the granularity of the resulting measurements, with smaller rotational intervals corresponding to a higher granularity.

In certain embodiments, this process may continue until the head 108 has completed a rotation, at which point the tool 100 may be positioned at a different depth. The group of azimuthal measurements taken at a particular depth may be referred to as a "scan." The number of azimuthal measurements taken to complete a scan may depend, for instance, on the granularity required by the combined measurements as well as downhole conditions. Although not shown, instead of a rotating head, the whole tool 100 or a portion thereof having the transducer 106 can be rotated to accomplish a similar azimuthal scan. For example, if the tool 100 is conveyed into the wellbore 150 via drill pipe, the drill pipe could be rotated to in-turn rotate the tool 100 and thereby the transducer 106.

Once received by the transducer 106, the echo signal 112 may be processed by one or more processors and control systems within the tool 100, at the surface of the formation 152, or elsewhere to determine characteristics of the casing 102 and cement layer 104, such as the cement impedance. As used herein a control system may comprise an information handling system or any other device that contains at least one processor communicably coupled to a non-transitory computer readable memory device containing a set of instructions that when executed by the processor, cause it to perform certain actions. Example processors include microprocessors, microcontrollers, digital signal processors (DSP), application specific integrated circuits (ASIC), field programmable gate arrays (FPGA), or any other digital or analog circuitry configured to interpret and/or execute program instructions and/or process data.

Figure 2:
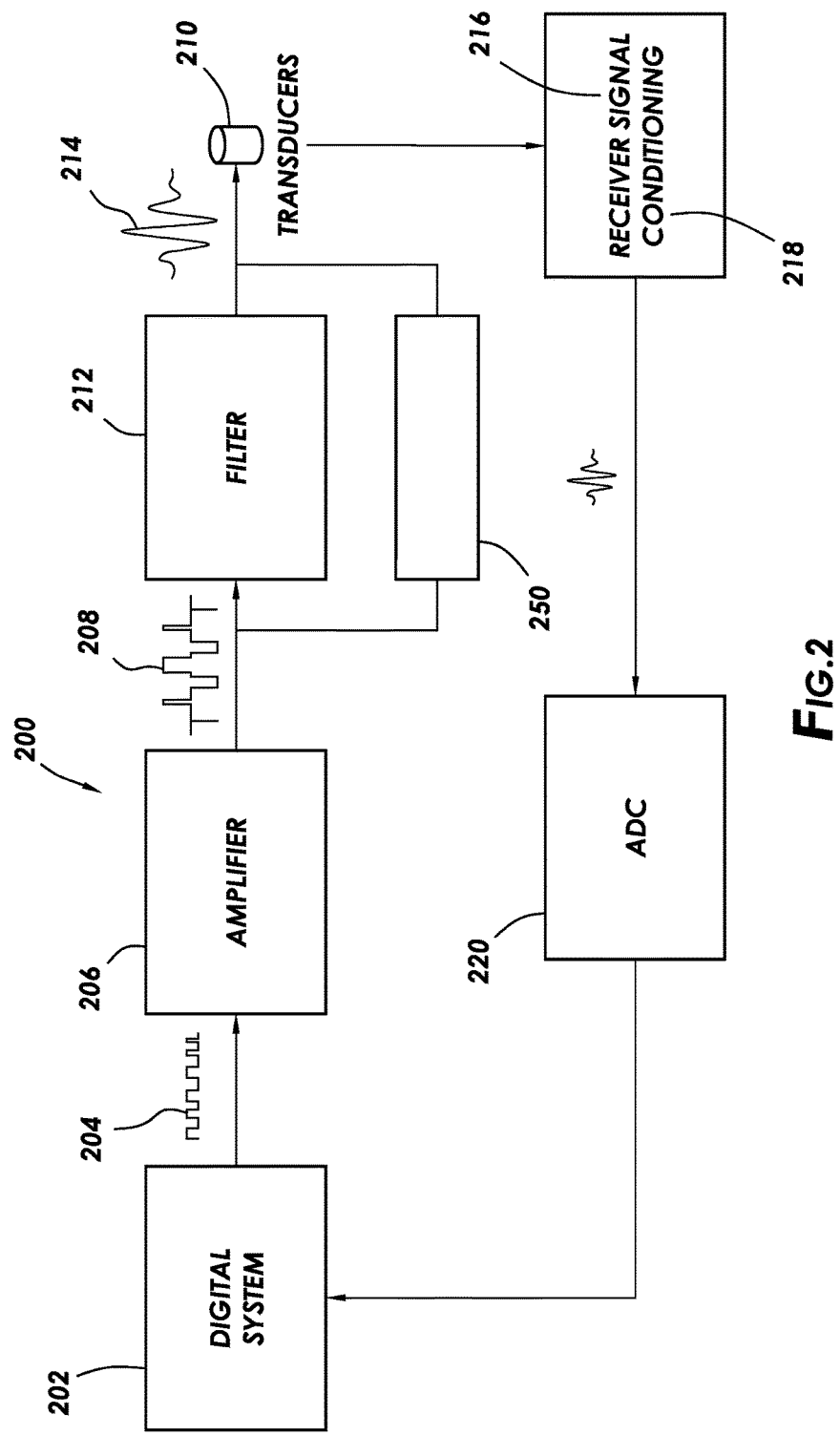
FIG. 2 is a block diagram of an example cement and casing evaluation tool, according to aspects of the present disclosure.

Electrical ringing from the transducer 106 and firing circuitry associated with the transducer 106 (described below) may act as noise that degrades the echo signal 112 and reduces the accuracy of the cement impedance determination. FIG. 2 is a block diagram of an example cement and casing evaluation tool 200, which may include firing circuitry, according to aspects of the present disclosure. The tool 200 comprises a digital control system 202 electrically coupled to a switching amplifier 206, such as an H-bridge amplifier, which is in turn electrically coupled to a filter 212. Some or all of the digital control system 202 may be located within the logging tool, at the surface, or a combination of the two. The filter 212 may be electrically coupled to the transducer 210. Examples filters include high-, low-, and band-pass filters as well as programmable filters. The configuration depicted is not intended to be limited.

In use, the digital control system 202 may generate sequential digital pulses 204 that are received by a switching amplifier 206. The digital pulses 204 may, in turn, cause the switching amplifier 206 to generate an approximated excitation pulse 208 for a transducer 210. The filter 212 may receive the pulse 208 and shape it into a desired voltage pulse 214. The desired voltage pulse 214 may cause the transducer 210 to generate an acoustic pulse with similar shape and frequency as the desired voltage pulse 214.

After the transducer 210 transmits the pulse, it may act as a receiver to receive and measure an echo signal 216 from the formation. The echo signal 216 may be received at signal conditioning circuitry 218 before it is digitized by an analog-to-digital converter 220 and received at the control system 202. The echo signal 216 may be processed at the control system 202 to determine formation characteristics and/or generate control signals for the tool, and/or stored within or transmitted from the control system 202 for processing at a remote information handling system.

In the embodiment shown, both the switching amplifier 206 and the filter 212 may be sources of electrical ringing because both include circuitry that can temporarily store electrical energy. The electrical ringing can be generated while that electrical energy is dissipating. Another source of ringing may be electro-mechanical ringing of the transducer 210. For instance, in a typical piezo-electric transducer, the desired voltage pulse 214 is translated into mechanical vibration, which generates the acoustic pulse. After the acoustic pulse is generated, residual mechanical vibrations may generate electrical energy due to the piezo-electric effect. When the transmission/reception window is small, such as when the transducer is close to the casing, and the echo must be received before this residual energy can dissipate, it is transmitted with the echo signal 216 to the digital system 202.

A ringing reduction system 250 may be included within the tool 200 to reduce the ringing noise associated with the elements of the tool 200 before the transducer 210 begins to receive the echo signal 216. This may reduce the noise associated with the echo signal 216 and increase the accuracy of the corresponding cement impedance determination. The ringing reduction system 250 may comprise circuitry that reduces electrical ringing by selectively dissipating the residual electrical energy associated with elements to which the system 250 is electrically connected. As depicted, the system 250 is coupled between the amplifier 206 and the filter 212, and between the filter 212 and the transducer 210 in order to dissipate residual energy/reduce ringing noise at the amplifier 206, filter 212, and transducer 210. Other ringing reduction system configurations are possible, including the use of multiple systems in place of a single system with different locations with respect to the amplifier, filter and transducer, or one or more systems the reduce ringing with respect to some but not all of the amplifier, filter and transducer.

Figure 3:
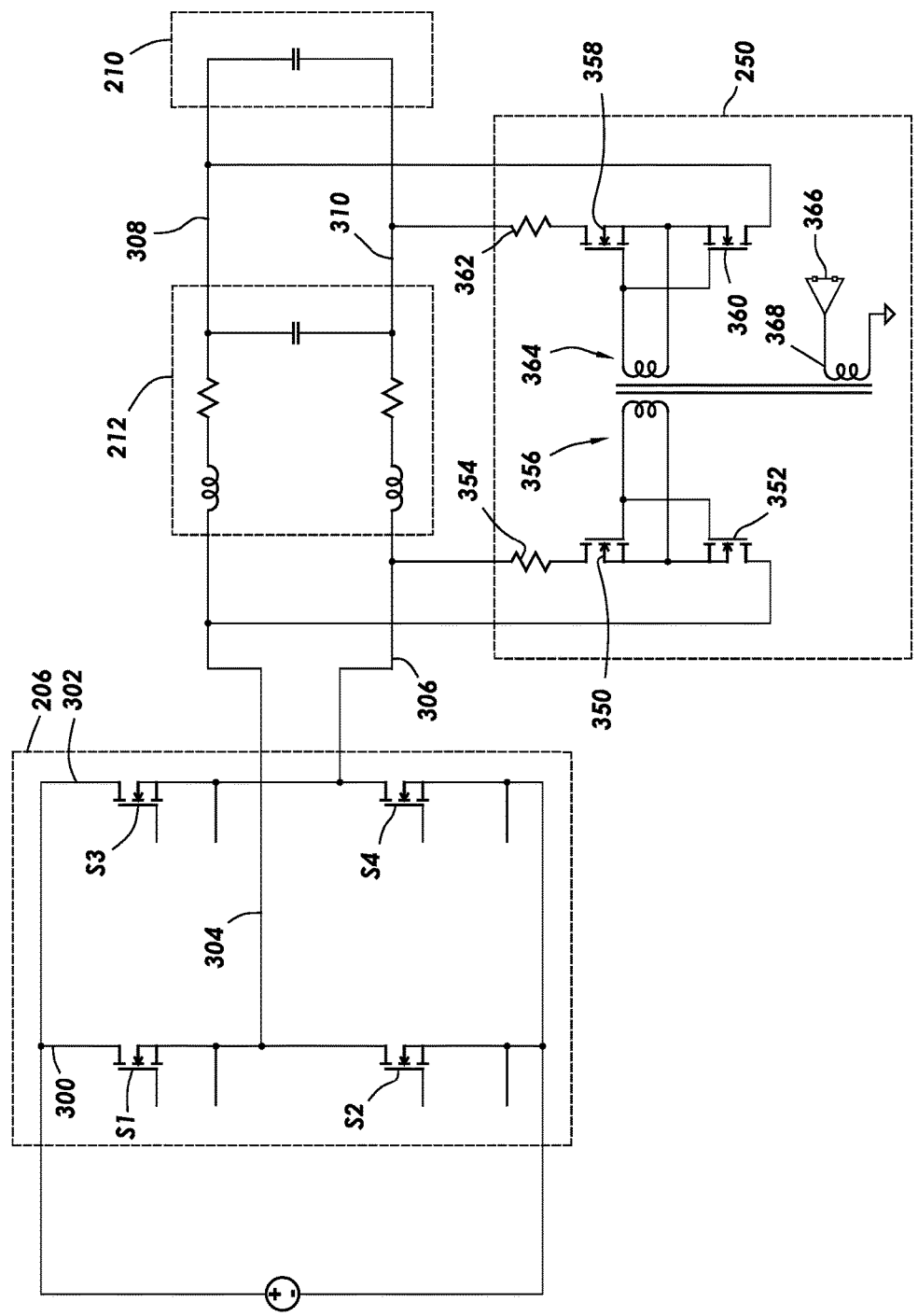
FIG. 3 is an example circuit diagram of the ringing reduction system, according to aspects of the present disclosure.

FIG. 3 is an example circuit diagram of the ringing reduction system 250, according to aspects of the present disclosure. The ringing reduction system 250 is coupled between the switching amplifier 206, filter 212, and transducer 210, each of which is also represented by example circuit diagrams. While circuitry is shown for 206, 212, and 210, other circuitry could be used with the ringing reduction system 250 without departing from the scope of the disclosure.

The switching amplifier 206 comprises an H-bridge amplifier with four transistor switches S1-S4. A first leg 300 of the amplifier 206 may conduct electricity when the switches S1 or S2 are turned on complementarily. A second leg 302 of the amplifier 206 may conduct electricity when the switches S3 or S4 are turned on complementarily. Leads 304 and 306 may connect the filter 212 between the legs 300 and 302 and conduct electricity between the amplifier 206 and the filter 212. Leads 308 and 310 may connect and conduct electricity between the filter 212 and the transducer 210.

The ringing reduction system 250 may comprise two "dump" circuits in the form of transistors connected back-to-back to form a bi-directional switch. The first dump circuit comprises transistors 350 and 352 connected in series with a resistor 354 between leads 304 and 306. Example transistors include, but are not limited to, Field Effect Transistors (FETs). The gates of transistors 350 and 352 are connected to a common gate drive circuit with a transformer winding 356. The second dump circuit comprises a similar configuration that includes two transistors 358 and 360 connected in series with a resistor 362 between leads 308 and 310, with the gates of the transistors 358 and 360 connected to a common gate drive circuit with a transformer winding 364 electrically associated with the transformer winding 356 and a third transformer winding 368 through which the dump circuits may be turned on via a control signal. In other embodiments, the dump circuits may be separated into multiple systems; other types of dump circuits may be used; and other types of energy dissipation circuitry may be used.

In use, the dump circuits may be turned on by sending a control signal to an amplifier 366 coupled to the transformer winding 368, causing the transformer winding 368 to generate a voltage across the transistor winding 356 and 364 of the gate drive circuits for the dump circuits. This may, in turn, apply a gate voltage to the transistors 350, 352, 358, and 360 causing them to short the input and output of the filter 212 and quickly dissipate residual energy from the amplifier 206, filter 212, and transducer 210 in the form of heat. Specifically, when transistors 350 and 352 are turned on, residual energy from the amplifier 206 may travel through leads 304 and 306 and dissipate within the transistors 350 and 352 and resistor 354. Likewise, when transistors 358 and 360 are turned on, residual energy from the transducer 210 may travel through leads 308 and 310 and dissipate within the transistors 358 and 360 and resistor 362. The resistors 354 and 358 may control the speed with which the residual energy is dissipated.

In one or more embodiments, the amplifier 366 may be connected to a control system such that the on/off sequence of the dump circuits and associated control signal may be programmable. Thus, the timing and duration of the control signal may be set such that the energy dissipation does not interfere with the initial pulse yet dissipates the residual energy before the echo signal is received. FIG. 4 includes two charts, the top chart illustrating the voltage signals for the amplifier and transducer of the example casing and cement evaluation tool described above with reference to FIG. 2, and the bottom chart illustrating an example dump circuit gate signal. As can be seen, a pulse 402 in the gate signal corresponds to an unwanted ringing 404 in the amplifier. This may produce the reduction in ringing illustrated in FIG. 5, which includes a chart showing transducer voltage with and without a damping circuit.

One or more of the apparatus, systems, and/or methods described above may be incorporated into/with a wireline tool/sonde for wireline logging operation or into/with one or more LWD/MWD tools for drilling operations. FIG. 6 is a diagram showing a subterranean drilling system 80 incorporating at least one acoustic LWD/MWD tool 26, according to aspects of the present disclosure. The drilling system 80 comprises a drilling platform 2 positioned at the surface 82. As depicted, the surface 82 comprises the top of a formation 84 containing one or more rock strata or layers 18a-c, and the drilling platform 2 may be in contact with the surface 82. In other embodiments, such as in an off-shore drilling operation, the surface 82 may be separated from the drilling platform 2 by a volume of water.

The drilling system 80 comprises a derrick 4 supported by the drilling platform 2 and having a traveling block 6 for raising and lowering a drill string 8. A kelly 10 may support the drill string 8 as it is lowered through a rotary table 12. A drill bit 14 may be coupled to the drill string 8 and driven by a downhole motor and/or rotation of the drill string 8 by the rotary table 12. As bit 14 rotates, it creates a borehole 16 that passes through one or more rock strata or layers 18. A pump 20 may circulate drilling fluid through a feed pipe 22 to kelly 10, downhole through the interior of drill string 8, through orifices in drill bit 14, back to the surface via the annulus around drill string 8, and into a retention pit 24. The drilling fluid transports cuttings from the borehole 16 into the pit 24 and aids in maintaining integrity of the borehole 16.

The drilling system 80 may comprise a bottom hole assembly (BHA) coupled to the drill string 8 near the drill bit 14. The BHA may comprise various downhole measurement tools and sensors and LWD and MWD elements, including the acoustic tool 26. In one or more embodiments, the tool 26 may comprise acoustic pulse excitation and echo/reflection reception functionality that will be described in detail below. As the bit extends the borehole 16 through the formations 18, the tool 26 may collect measurements relating to borehole 16 and the formation 84. In certain embodiments, the orientation and position of the acoustic tool 26 may be tracked using, for example, an azimuthal orientation indicator, which may include magnetometers, inclinometers, and/or accelerometers, though other sensor types such as gyroscopes may be used in some embodiments.

The tools and sensors of the BI-IA including the tool 26 may be communicably coupled to a telemetry element 28. The telemetry element 28 may transfer measurements from acoustic tool 26 to a surface receiver 30 and/or to receive commands from the surface receiver 30. The telemetry element 28 may comprise a mud pulse telemetry system, and acoustic telemetry system, a wired communications system, a wireless communications system, or any other type of communications system that would be appreciated by one of ordinary skill in the art in view of this disclosure. In certain embodiments, some or all of the measurements taken at the tool 26 may also be stored within the tool 26 or the telemetry element 28 for later retrieval at the surface 82.

In certain embodiments, the drilling system 80 may comprise a surface control unit 32 positioned at the surface 82. The surface control unit 32 may comprise an information handling system communicably coupled to the surface receiver 30 and may receive measurements from the acoustic tool 26 and/or transmit commands to the acoustic tool 26 though the surface receiver 30. The surface control unit 32 may also receive measurements from the acoustic tool 26 when the acoustic tool 26 is retrieved at the surface 82. As is described above, the surface control unit 32 may process some or all of the measurements from the acoustic tool 26 to determine certain parameters of downhole elements, including the borehole 16 and formation 84.

At various times during the drilling process, the drill string 8 may be removed from the borehole 16 as shown in FIG. 7. Once the drill string 8 has been removed, measurement/logging operations can be conducted using a wireline tool 34, e.g., an instrument that is suspended into the borehole 16 by a cable 15 having conductors for transporting power to the tool and telemetry from the tool body to the surface 82. The wireline tool 34 may comprise an acoustic tool 36, similar to the acoustic tool 26 described above. The tool 36 may be communicatively coupled to the cable 15. A logging facility 44 (shown in FIG. 5 as a truck, although it may be any other structure) may collect measurements from the acoustic tool 36, and may include computing facilities (including, e.g., a control unit/information handling system) for controlling, processing, storing, and/or visualizing some or all of the measurements gathered by the tool 36. The computing facilities may be communicatively coupled to the acoustic tool 36 by way of the cable 15. In certain embodiments, the control unit 32 may serve as the computing facilities of the logging facility 44.

An example cement and casing evaluation tool includes an amplifier and a filter coupled an output of the amplifier. A transducer may be coupled to the output of the filter. A ringing reduction system may be coupled to at least one of the amplifier, the filter, and the transducer, wherein the ringing reduction system selectively dissipates energy from at least one of the amplifier, the filter, and the transducer in response to a control signal.

In one or more embodiments described in the preceding paragraph, the ringing reduction system comprises a circuit with a first resistor, a first transistor, and a second transistor connected in series, with the first transistor and second transistor coupled to a first common gate drive circuit.

In one or more embodiments described in the preceding two paragraphs, the circuit includes a second resistor, a third transistor, and a fourth transistor connected in series, with the third transistor and fourth transistor coupled to a second common gate drive circuit.

In one or more embodiments described in the preceding three paragraphs, the first common gate drive circuit comprises a first transformer winding, the second gate drive circuit comprises a second transformer winding, and the first transformer winding is electrically associated with the second transformer winding.

In one or more embodiments described in the preceding four paragraphs, the first transformer winding and the second transformer winding are electrically associated with a third transformer winding coupled to a control amplifier.

In one or more embodiments described in the preceding five paragraphs, a controller may be electrically coupled to the control amplifier.

In one or more embodiments described in the preceding six paragraphs, the control amplifier generates a voltage across the third transformer winding in response to a control signal from the controller.

In one or more embodiments described in the preceding seven paragraphs, a signal conditioning circuitry may be coupled to the transducer to receive a signal from the transducer.

In one or more embodiments described in the preceding eight paragraphs, a controller is configured to transmit the control signal to the control amplifier after a signal transmission from the transducer.

In one or more embodiments described in the preceding nine paragraphs, an analog-to-digital converter may be coupled to the signal conditioning circuitry.

An example method may include generating an excitation voltage pulse for a transducer using circuitry coupled to the transducer. An acoustic pulse may be transmitted from the transducer based, at least in part, on the excitation voltage pulse. At least one of electrical energy from the circuity and mechanical ringing energy from the transducer may be selectively dissipated after transmitting the acoustic pulse. An echo signal corresponding to the acoustic pulse may be received at the transducer.

In one or more embodiments described in the preceding paragraph, selectively dissipating at least one of electrical energy from the circuity and mechanical ringing energy from the transducer after transmitting the acoustic pulse reduces noise and distortion on the receiver echo signal.

In one or more embodiments described in the preceding two paragraphs, generating the excitation voltage pulse for the transducer using circuitry coupled to the transducer comprises generating a voltage signal from an amplifier and receiving the voltage signal at a filter coupled to the transducer.

In one or more embodiments described in the preceding three paragraphs, selectively dissipating at least one of electrical energy from the circuity and mechanical ringing energy from the transducer after transmitting the acoustic pulse comprises triggering a ringing reduction system coupled to least one of the amplifier, the filter, and the transducer.

In one or more embodiments described in the preceding four paragraphs, the ringing reduction system comprises a circuit with a first resistor, a first transistor, and a second transistor connected in series, with the first transistor and second transistor coupled to a first common gate drive circuit.

In one or more embodiments described in the preceding five paragraphs, the circuit includes a second resistor, a third transistor, and a fourth transistor connected in series, with the third transistor and fourth transistor coupled to a second common gate drive circuit.

In one or more embodiments described in the preceding six paragraphs, the first common gate drive circuit comprises a first transformer winding, the second gate drive circuit comprises a second transformer winding, and the first transformer winding is electrically associated with the second transformer winding.

In one or more embodiments described in the preceding seven paragraphs, the first transformer winding and the second transformer winding are electrically associated with a third transformer winding coupled to a control amplifier.

In one or more embodiments described in the preceding eight paragraphs, a controller may be electrically coupled to the control amplifier.

In one or more embodiments described in the preceding nine paragraphs, the control amplifier generates a voltage across the third transformer winding in response to a control signal from the controller.

Therefore, the present disclosure is well adapted to attain the ends and advantages mentioned as well as those that are inherent therein. The particular embodiments disclosed above are illustrative only, as the present disclosure may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered or modified and all such variations are considered within the scope and spirit of the present disclosure. Also, the terms in the claims have their plain, ordinary meaning unless otherwise explicitly and clearly defined by the patentee. The indefinite articles "a" or "an," as used in the claims, are defined herein to mean one or more than one of the element that it introduces.

What is claimed is:

1. A cement and casing evaluation tool, comprising:
   an amplifier;
   a filter coupled to an output of the amplifier; a transducer coupled to the output of the filter; and
   a ringing reduction system coupled to at least one of the amplifier, the filter, and the transducer, wherein the ringing reduction system selectively dissipates energy from at least one of the amplifier, the filter, and the transducer in response to a control signal; and wherein the ringing reduction system comprises a circuit with a first resistor, a first transistor, and a second transistor connected in series, with the first transistor and second transistor coupled to a first common gate drive circuit.

2. The tool of claim 1, wherein the circuit includes a second resistor, a third transistor, and a fourth transistor connected in series, with the third transistor and fourth transistor coupled to a second common gate drive circuit.

3. The tool of claim 2, wherein first common gate drive circuit comprises a first transformer winding, the second gate drive circuit comprises a second transformer winding, and the first transformer winding is electrically associated with the second transformer winding.

4. The tool of claim 3, wherein the first transformer winding and the second transformer winding are electrically associated with a third transformer winding coupled to a control amplifier.

5. The tool of claim 4, further comprising a controller electrically coupled to the control amplifier.

6. The tool of claim 5, wherein the control amplifier generates a voltage across the third transformer winding in response to a control signal from the controller.

7. The tool of claim 1, further comprising a signal conditioning circuitry coupled to the transducer to receive a signal from the transducer.

8. The tool of claim 6, wherein a controller is configured to transmit the control signal to the control amplifier after a signal transmission from the transducer.

9. The tool of claim 7, further comprising an analog-to-digital converter coupled to the signal conditioning circuitry.

10. A method comprising,
generating an excitation voltage pulse for a transducer using circuitry coupled to the transducer;
transmitting an acoustic pulse from the transducer based, at least in part, on the excitation voltage pulse;
selectively dissipating at least one of electrical energy from the circuity and mechanical ringing energy from the transducer after transmitting the acoustic pulse, wherein selectively dissipating at least one of electrical energy from the circuity and mechanical ringing energy from the transducer after transmitting the acoustic pulse comprises triggering a ringing reduction system coupled to least one of the amplifier, the filter, and the transducer, wherein the ringing reduction system comprises a circuit with a first resistor, a first transistor, and a second transistor connected in series, with the first transistor and second transistor coupled to a first common gate drive circuit; and
receiving at the transducer an echo signal corresponding to the acoustic pulse.

11. The method of claim 10, wherein selectively dissipating at least one of electrical energy from the circuity and mechanical ringing energy from the transducer after transmitting the acoustic pulse reduces noise and distortion on the receiver echo signal.

12. The method of claim 10, wherein generating the excitation voltage pulse for the transducer using circuitry coupled to the transducer comprises generating a voltage signal from an amplifier and receiving the voltage signal at a filter coupled to the transducer.

13. The method of claim 10, wherein the circuit includes a second resistor, a third transistor, and a fourth transistor connected in series, with the third transistor and fourth transistor coupled to a second common gate drive circuit.

14. The method of claim 13, wherein the first common gate drive circuit comprises a first transformer winding, the second gate drive circuit comprises a second transformer winding, and the first transformer winding is electrically associated with the second transformer winding.

15. The method of claim 14, wherein the first transformer winding and the second transformer winding are electrically associated with a third transformer winding coupled to a control amplifier.

16. The method of claim 15, further comprising a controller electrically coupled to the control amplifier.

17. The method of claim 16, wherein the control amplifier generates a voltage across the third transformer winding in response to a control signal from the controller.

\* \* \* \* \*